United States Patent [19]
Sado

[11] Patent Number: 4,696,048
[45] Date of Patent: Sep. 22, 1987

[54] INPUT DEVICE
[75] Inventor: Ichiro Sado, Yokohama, Japan
[73] Assignee: Canon Kabushiki Kaisha, Tokyo, Japan
[21] Appl. No.: 912,652
[22] Filed: Sep. 29, 1986

Related U.S. Application Data

[63] Continuation of Ser. No. 505,859, Jun. 20, 1983, abandoned.

[30] Foreign Application Priority Data

Jun. 28, 1982 [JP] Japan ................................ 57-109955

[51] Int. Cl.⁴ .............................................. G06K 9/00
[52] U.S. Cl. ......................................... 382/13; 178/18
[58] Field of Search ..................................... 178/18–20; 382/4, 17, 18, 13

[56] References Cited

U.S. PATENT DOCUMENTS 3,290,651 12/1966 Paufve et al. .......................... 382/18
3,652,990 3/1972 Darwin .................................. 382/17
3,781,855 12/1973 Killen ..................................... 382/4

Primary Examiner—Leo H. Boudreau
Attorney, Agent, or Firm—Fitzpatrick, Cella, Harper & Scinto

[57] ABSTRACT

An input device has a matrix input unit having a plurality of switches for inputting a pattern, a signal generator for generating signals identifying the actuation of the switches, and a discriminator responsive to the signals from the signal generator to discriminate the actuated one of the switches. The discriminator discriminates the actuated switch by checking an interval of the signals from the sequentially actuated switches.

12 Claims, 9 Drawing Figures

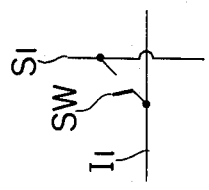
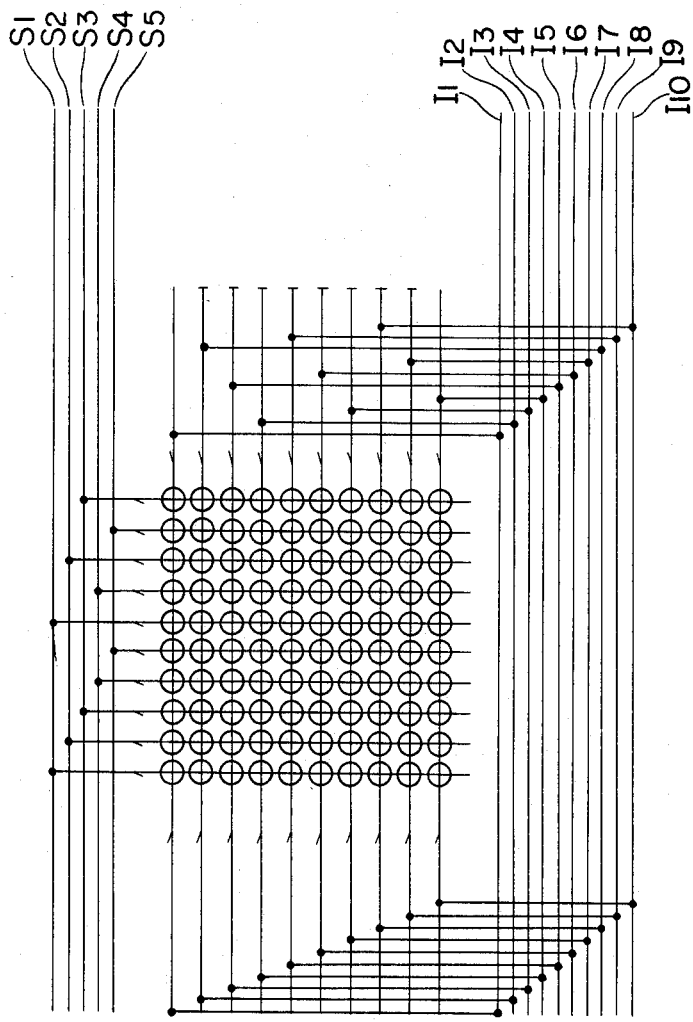

FIG. 4
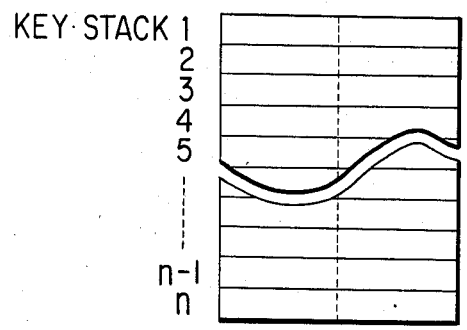
KEY·STACK 1, 2, 3, 4, 5, ..., n-1, n
FIG. 5
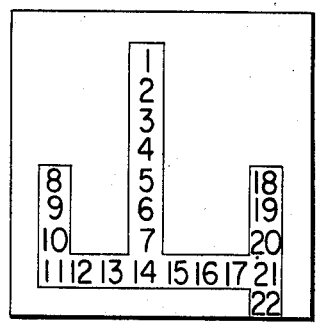
FIG. 6
| STEP | CODE | T |
|---|---|---|
| 1 | I2·S5 | 1 |
| 2 | I3 | 0 |
| 3 | I4 | 0 |
| 4 | I5 | 0 |
| 5 | I6 | 0 |
| 6 | I7 | 0 |
| 7 | I8 | 0 |
| 8 | I6·S2 | 1 |
| 9 | I7 | 0 |
| 10 | I8 | 0 |
| 11 | I9 | 0 |
| 12 | S3 | 0 |
| 13 | S4 | 0 |
| 14 | S5 | 0 |
| 15 | I7·S1 | 0 |
| 16 | S4 | 0 |
| 17 | S2 | 0 |
| 18 | I6·S5 | 1 |
| 19 | I3 | 0 |
| 20 | I10 | 0 |
| 21 | I7 | 0 |
| 22 | I4 | 0 |
| 23 | — | — |
| ⋮ | ⋮ | ⋮ |
| n | — | — | they result in increases in cost and size of the equipment.

INPUT DEVICE

This application is a continuation of application Ser. No. 505,859 filed June 20, 1983 now abandoned.

BACKGROUND OF THE INVENTION

1. Field of the Invention

The present invention relates to an input device for inputting a graphic pattern such as a hand-written character by using a switching matrix, and more particularly to an input device which can reduce the number of signal lines to be taken out when the device is implemented by an integrated circuit module.

2. Description of the Prior Art

In the development of large scale integrated circuit (LSI) modules, the signal processing capability of the integrated circuit module has remarkably been increased. On the other hand, the number of integrated circuit modules used has been reduced and the number of signal lines taken out of the internal circuits is restricted by the number of input/output terminals which can be provided in the integrated circuit module. For example, in a 16 ×16 switching matrix circuit, it is necessary to take out 16 input signal lines and 16 output signal lines, or total of 32 signal lines from the LSI module. As a result, a bonding area on the LSI wafer, terminals of the LSI package and a pattern area on a printed circuit board are factors in cost increases and result in increases in the size of the equipment.

SUMMARY OF THE INVENTION

It is an object of the present invention to provide an input device which can reduce the number of signal lines, particularly the number of output signal lines to be taken out from an integrated circuit so that a compact and inexpensive integrated circuit package is provided.

It is another object of the present invention to provide an input device comprising matrix input means having a plurality of switches arranged for inputting a pattern, signal generating means for generating a signal to identify the actuation of the switches, and discrimination means responsive to the signal supplied from the signal generating means through the matrix input means for discriminating the switch actuated, which discrimination means examines an interval of the signals supplied from the sequentially actuated switches to discriminate the actuated switch.

It is another object of the present invention to provide an input device comprising a plurality of switching matrices, signal generating means for generating a plurality of signals, signal supply means for supplying the signals to the plurality of switch matrices in different patterns from each other, signal receiving means for receiving the signals from the plurality of switching matrices in different patterns, and discrimination means for discriminating the actuated ones of the plurality of switching matrices by the signals from the signal receiving means.

The other objects of the present invention will be apparent from the following description taken in conjunction with the drawings.

BRIEF DESCRIPTION OF THE DRAWINGS

FIG. 1A shows a circuit diagram of a pattern input unit having a switching matrix circuit in an input device of the present invention, FIG. 1B is a circuit diagram of an example of the matrix switch, FIG. 4 is a diagram showing an arrangement of key stacks, FIG. 5 is a diagram showing a stroke sequence of an input pattern, FIG. 6 is a diagram showing a manner of storing data in the key stacks.

DETAILED DESCRIPTION OF THE PREFERRED EMBODIMENTS

FIG. 1A shows an example of the wiring arrangement in the input device of the present invention. In the illustrated arrangement, input/output signal lines comprising ten input signal lines I1–I10 and five output signal lines S1–S5 are arranged for a handwritten pattern input unit having $10 \times 10$ (=100) switch contacts. A matrix switch SW as shown in FIG. 1B is arranged at each of the crosspoints of the input/output signal lines I1–I10 and S1–S5. The switches SW are shown by circles O in FIG. 1A. As shown in FIG. 1A, the pattern input unit is divided into left and right quadrants. In the left quadrant, the input signal lines I1–I5 and I6–I10 sequentially correspond to the output signal lines S1–S5. In the right quadrant, the input signal lines I1, I8, I5, I2, ... at every seventh occurrence correspond to the output signal lines S1–S5 and the output signal lines S1, S4, S2, S5, ... at every third occurrence correspond to the input signal lines I1–I10. Accordingly, when a handwritten pattern is inputted to the switch matrix, the quadrant of the switch contact at the position corresponding to the pattern can be determined by the sequence of the output signal lines corresponding to the sequence of the input signal lines.

Figure 2:
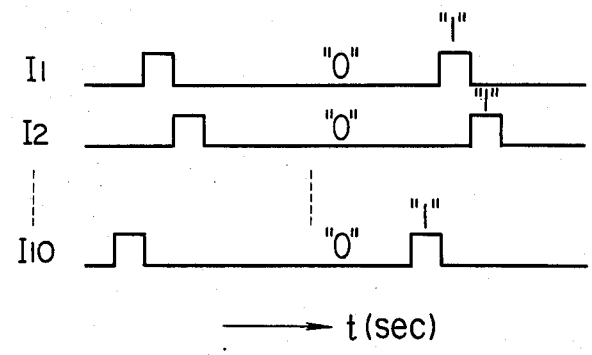
FIG. 2 shows a signal waveform of a scan pulse in the pattern input unit.

FIG. 2 shows an example of timing pulses for scanning the sequential input signal lines I1–I10. In a well-known dynamic scan system, the input timing pulses I1–I10 are sequentially supplied to the output signal lines S1–S5 and key codes are composed by the combinations of the input signal line numbers I and the output signal line numbers S.

Figure 3:
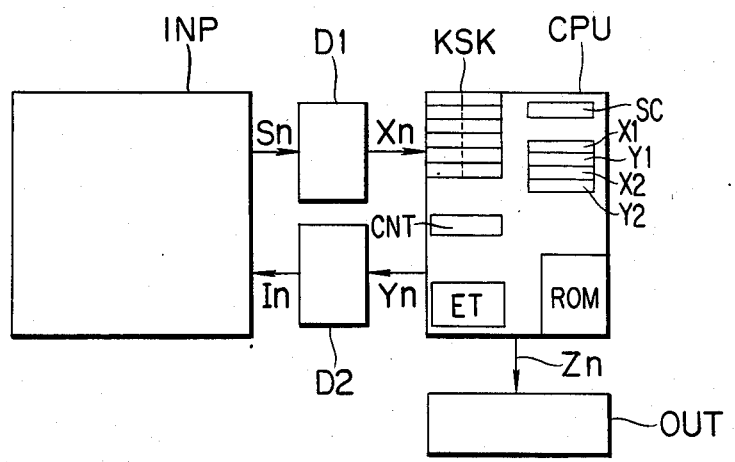
FIG. 3 is a block diagram of the input device of the present invention.

An overall configuration of the input device of the present invention is shown in FIG. 3, in which INP denotes the pattern input unit of FIG. 1A, CPU denotes a processor, KSK denotes a key stack memory which stores key code signals Xn. SC denotes a stack counter which specifies an address of the key stack memory, X1, X2, Y1 and Y2 denote working registers, CNT denotes a counter which counts time, ROM denotes a control memory which stores a control sequence shown in FIG. 7, and ET denotes a table. After the quadrant of the content of the key stack memory has been discriminated, a code thereof is set in the table. Yn denotes a coded key input signal supplied from the processor CPU, D2 denotes a decoder for decoding the key input signal Yn to the scan pulse as shown in FIG. 3, d1 denotes a key code generator which receives the output signals S1–S5 from the pattern input unit INP and generates the key code signals Xn corresponding to the input pattern by the combination with the scan pulse In, and OUT denotes a display which displays an output signal Zn of the processor CPU.

An example of a key stack in a memory of the processor CPU which stores the key code signals Xn of the input pattern is shown in FIG. 4. The key stack stores the key code signals Xn in the sequence of entry and also stores discrimination signals paired with the key code signals Xn, for discriminating whether the output signals Sn from the pattern input unit INP for forming the sequential key code signals Xn were generated sequentially with respect to the scan pulse In or generated at an interval of a predetermined number of scan pulses, that is, whether they were generated in the left quadrant of the pattern input unit of FIG. 1A or in the right quadrant. The purpose for storing the pairs of the key code signals and the discrimination signals is as follows.

As shown in FIG. 5, let us assume that a kanji character "い" is inputted to the pattern input unit having the 10×10 switching matrix. Assuming that the strokes of the character "い" are written as indicated by the order of the numerals shown in FIG. 5, the key code signals Xn are stored in the key stack of FIG. 4 in that order. In a usual hand-written pattern input process, the movement from points 6 to 7 in FIG. 5 is much faster than the movement from points 7 to 8. The difference between the velocities of movement is counted and discriminated by the counter CNT in the processor CPU and the resulting discrimination signal is stored in the key stack KSK in pair with the key code signal Xn.

An example of the key code signals stored in the key stack KSK of FIG. 4 when the hand-written kanji pattern "い" of FIG. 5 is entered into the pattern input unit of FIG. 1A is shown in FIG. 6, in which the key code signals are represented by the input/output signal line numbers which form the key code signals instead of the actually generated binary codes and the identification signals for indicating the velocities of the sequential inputs are represented by "1" or "0" intervals T of the input timing. In FIG. 6, STEP indicates writing steps represented by the stroke sequence of the hand-written input process of FIG. 5. For example, in a step 8 of FIG. 6, the input/output signal line numbers are I6 and S2, and the discrimination signal T is "1" which represents the timing interval for the movement from points 7 to 8. The timing intervals in both adjacent steps are "0". It is, therefore, determined that the pattern input was temporarily interrupted at the stroke 7→8. In a step 14, the timing interval T is "0" and the timing intervals in both adjacent steps are also "0" but the input/output signal line numbers representing the key code signal changes between the steps 14 and 15 and the output signal line number subsequently changes at every third step. Accordingly, it is determined that the hand-written input pattern moved from the left quadrant to the right quadrant in the pattern input unit of FIG. 1. As seen from FIG. 1A, when the output signal line number changes from S5 to S1 for the sequential change of the input signal line number, it is determined that the input pattern moved from the left quadrant to the right quadrant, and when the output signal line number changes from S1 to S5, it is determined that the input pattern moved from the right quadrant to the left quadrant. In any case, in the steps 2 to 15 in the key stack of FIG. 6, it is determined from the change of the key code signal and the status of the timing interval T that the hand-written input was made in the left quadrant of the pattern input unit of FIG. 1A.

Figure 7:
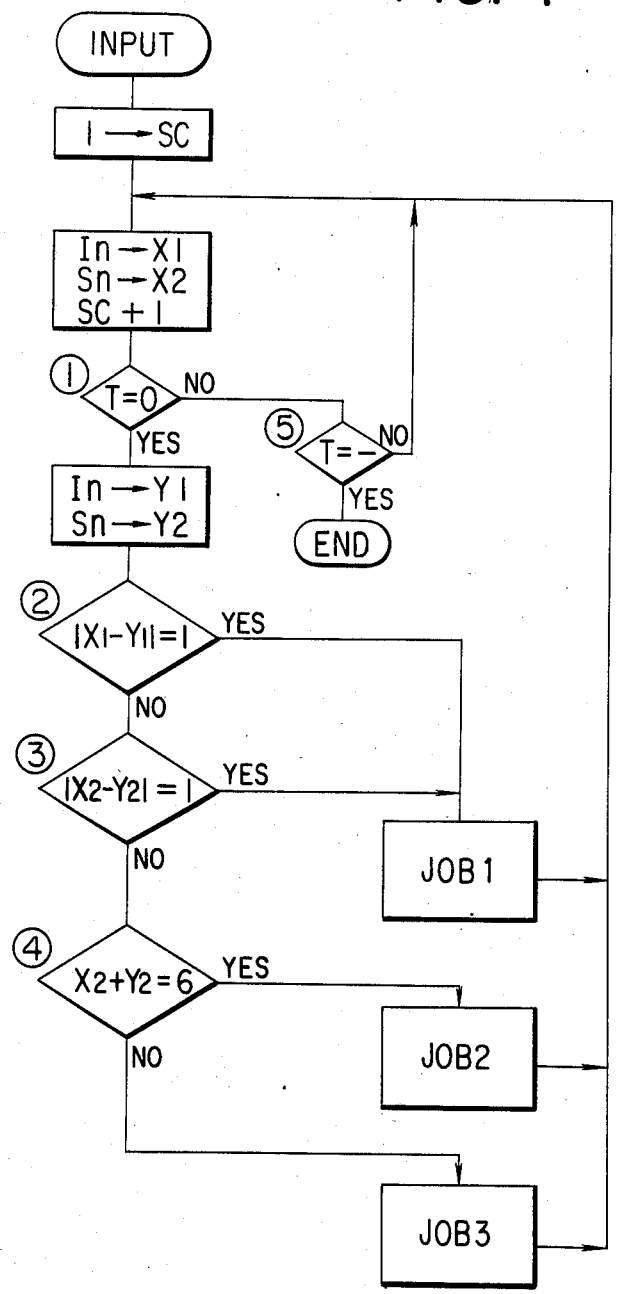
FIG. 7 is a flow chart for signal processing.
Figure 8:
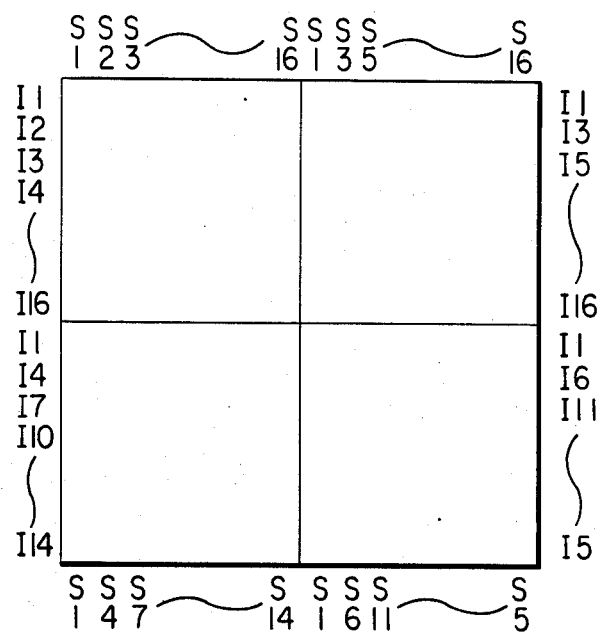
FIG. 8 shows a circuit diagram of another configuration of the pattern input unit having the switching matrix circuit.

FIG. 7 shows a flow chart for discriminating the quadrant of the input pattern by the processor CPU. In FIG. 7, SC denotes the stack counter for specifying the store address of the key stack of FIG. 4 and X1, X2, Y1 and Y2 denote the working registers.

First, it is regarded that the key code signals have been stored in the key stack and the key stack address SC is set to "1" so that the input signal line number In stored at the address 1 is loaded in the register X1 and the output signal line number Sn is loaded in the register X2. Then, the stack address SC is incremented. In a step ①, the timing interval T is checked. Since T is "0" in the illustrated example, the input signal line number is loaded in the register Y1 and the output signal line number is loaded in the register Y2 in the following step, and in a step ②, a difference |X1−Y1| between the input signal line numbers stored in the registers X1 and Y1 is checked, and in a step ③, a difference |X2−Y2| between the output line numbers X2 and Y2 is checked. If any one of the differences is "1", it is determined that the sequential movement of the switch contacts occurred in the left quadrant of the input pattern unit of FIG. 1A and signal processing for the left quadrant is performed (JOB1). Then, the process returns to the initial state. If neither |X1−Y1| nor |X2−Y2| is "1" in the steps ② and ③, the process goes to a step ④ where a sum of the input line numbers stored in the registers X2 and Y2 is compared with "6" to determine if the output signal line number in the input pattern of FIG. 1A changed from S1 to S5 or from S5 to S1. If the sum is equal to "6", it is determined that the movement across the left and right quadrants in the input pattern of FIG. 1A occurred and necessary processing is performed (JOB2). If the sum is not equal to "6", it is determined that non-sequential movement of the switch contact occurred in the right quadrant of the input pattern of FIG. 1A and necessary processing is carried out (JOB3). Then, the process returns to the initial state.

The 10×10 switching matrix circuit is inherently provided with ten input signal lines I1–I10 and ten output signal lines S1–S10. However, the input device of the present invention is provided with only five output signal lines S1–S5 which are dually combined with the ten input signal lines I1–I10 in the left and right quadrants, and the data in the key stack which represent the addresses of the switch contacts in the left and right quadrants by the input/output signal line numbers I1–I10 and S1–S5 are converted to represent the input-/output signal lines I1–I10 and S1–S10.

For example, in the JOB3, the input/output signal line numbers I10 and S4 corresponding to the key code at the final step 22 of the stroke sequence shown in FIG. 5 are converted to the input/output signal line numbers I10 and S9. Such a code conversion may be readily attained by a combination of a decoder and an encoder. In the JOB2 which is carried out when the sum (X2+Y2) of the output signal line numbers is equal to "6", the movement of the right quadrant is discriminated if the output signal line number changes from S5 to S1 and the same code conversion as that in the JOB3 is performed, and if the output signal line number changes from S5 to S1, the movement to the left quadrant is discriminated and the same code conversion as that in the JOB1 is performed.

In this manner, the input pattern codes converted in the JOB's 1–3 are supplied to the display OUT having the 10×10 dot matrix to display the kanji character " " as shown in FIG. 5. By supplying the input pattern code to a pattern recognition apparatus, information such as "YAMA" or "SAN" can be retrieved from the kanji character " ".

Instead of dividing the switching matrix circuit of the pattern input unit of FIG. 1A into the two quadrants, i.e., the left and right quadrants, it may be divided into four quadrants with the sequence of arrangement of the input/output signal lines being different in the respective quadrants so that 32×32 switching matrix circuit can be processed with 16 input signal lines and 16 output signal lines or total of 32 input/output signal lines. A flow chart of signal processing therefor will be readily understood from the flow chart for the two-quadrant matrix circuit shown in FIG. 7. Based on the sequential and non-sequential changes of the strokes of the timing intervals T stored in pair with the input/output signal line numbers, one of the four quadrants in which the stroke of the input pattern moved can be readily determined.

As described hereinabove, according to the present invention, the number of input/output signal lines required to the input device comprising the switching matrix circuit, particularly the number of output signal lines is remarkably reduced in comparison with prior art device, and the input devices can be implemented by a compact and inexpensive integrated circuit.

What I claim is:

1. An input device comprising:
a plurality of selectively actuable switching matrices;
signal generating means for generating a plurality of signals;
signal scanning means for supplying said signals to each of said plurality of switching matrices in different scanning patterns;
signal receiving means for receiving said plurality of signals from said plurality of switching matrices in different scanning patterns; and
discrimination means for discriminating an actuated one of said plurality of switching matrices by said plurality of signals from said signal receiving means.

2. An input device according to claim 1, wherein said signal generating means generates signals of different phases.

3. An input device according to claim 1, wherein said plurality of switching matrices each comprises a plurality of switch members.

4. An input device according to claim 3, wherein said discrimination means has a memory for storing signals representing the actuated ones of said plurality of switches of said plurality of switching matrices, said memory having a plurality of memory locations.

5. An input device comprising:
matrix input means having a plurality of selectively actuable switches arranged for inputting a pattern;
signal generating means for generating signals for indicating the actuation of said switches;
signal scanning means for supplying each of said signals of said signal generating means to each of said plurality of switches in different scanning patterns; and
discrimination means responsive to the signals supplied from said signal generating means through said matrix input means for discriminating an actuated one of said plurality of switches, wherein said discrimination means discriminates the actuated switch by checking the intervals between the signals from sequentially actuated switches.

6. An input device according to claim 5, wherein said discrimination means has a memory for storing key signals supplied from the actuated switches, said memory having a memory capacity for storing a plurality of key signals.

7. An input device according to claim 5, wherein said matrix input means has a plurality of matrices.

8. An input device according to claim 7, wherein said plurality of matrices are connected to receive the signals from said signal generating means in different patterns.

9. An input device according to claim 7, wherein said plurality of matrices are connected to said discrimination means to supply the signals to different signal lines.

10. An input device according to claim 5, further comprising means for visualizing the signal discriminated by said discrimination means.

11. An input device comprising:
a plurality of selectively actuable switching matrices;
signal generating means for generating a plurality of signals;
signal scanning means for supplying said signals to each of said plurality of switching matrices;
signal receiving means for receiving said plurality of signals in different scanning patterns from each of said plurality of switching matrices; and
discrimination means for discriminating an actuated one of said plurality of switching matrices by said plurality of signals from said signal receiving means.

12. An input device according to claim 11, wherein said signal generating means has a decoder and is supplied with a code signal.

* * * * *

UNITED STATES PATENT AND TRADEMARK OFFICE
CERTIFICATE OF CORRECTION

PATENT NO. : 4,696,048

DATED : September 22, 1987

INVENTOR(S) : ICHIRO SADO

Page 1 of 2

It is certified that error appears in the above-identified patent and that said Letters Patent is hereby corrected as shown below:

COLUMN 1

Line 10, "hand-written" should read --handwritten--.
    Line 16, "large scale" should read --large-scale--.
    Line 24, "16 X16" should read --16 X 16--.
    Line 26, "or total" should read --or a total--.

COLUMN 2

Line 64, "pulse as" should read --pulse In--.
    Line 64, "dl" should read --Dl--.

COLUMN 3

Line 23, "hand-written" should read --handwritten--.
    Line 31, "hand-written" should read --handwritten--.
    Line 40, "hand-written" should read --handwritten--.
    Line 54, "hand-written" should read --handwritten--.
    Line 66, "hand-written" should read --handwritten--.

UNITED STATES PATENT AND TRADEMARK OFFICE
CERTIFICATE OF CORRECTION

PATENT NO. : 4,696,048

DATED : September 22, 1987

INVENTOR(S) : ICHIRO SADO

It is certified that error appears in the above-identified patent and that said Letters Patent is hereby corrected as shown below:

COLUMN 5

Line 12, "or total" should read --or a total--.
Line 26, "device," should read --devices,--.
Line 26, "devices" should read --device--.

Signed and Sealed this

Twenty-ninth Day of March, 1988

Attest:

DONALD J. QUIGG

Attesting Officer     Commissioner of Patents and Trademarks